(12) United States Patent
Swanenberg et al.

(10) Patent No.: US 8,749,223 B2
(45) Date of Patent: Jun. 10, 2014

(54) GALVANIC ISOLATION DEVICE AND METHOD

(75) Inventors: Maarten Jacobus Swanenberg, Berg en Dal (NL); Dusan Golubovic, Leuven (BE)

(73) Assignee: NXP B.V., Eindhoven (NL)

( * ) Notice: Subject to any disclaimer, the term of this patent is extended or adjusted under 35 U.S.C. 154(b) by 475 days.

(21) Appl. No.: 13/165,868

(22) Filed: Jun. 22, 2011

(65) Prior Publication Data
US 2012/0326699 A1 Dec. 27, 2012

(51) Int. Cl.
*G01R 19/00* (2006.01)
*H01L 21/331* (2006.01)
*H01L 21/70* (2006.01)

(52) U.S. Cl.
USPC ......... 324/76.11; 438/353; 257/501; 257/500

(58) Field of Classification Search
USPC ............... 324/76.11; 257/501, 500, 499, 506, 257/725, 93, 374, 446; 438/318, 353, 196, 438/207, 218, 294, 248, 391
See application file for complete search history.

(56) References Cited

U.S. PATENT DOCUMENTS

| | | | |
|---|---|---|---|
| 5,841,197 A * | 11/1998 | Adamic, Jr. | 257/777 |
| 6,147,542 A | 11/2000 | Yaklin | |
| 6,282,107 B1 * | 8/2001 | Vinciarelli | 363/56.09 |
| 6,469,564 B1 * | 10/2002 | Jansen | 327/365 |
| 7,321,125 B1 * | 1/2008 | Olson et al. | 250/441.11 |
| 7,768,808 B2 * | 8/2010 | Soldano | 363/127 |
| 2001/0041393 A1 | 11/2001 | Hargrove et al. | |
| 2007/0075393 A1 | 4/2007 | Ikuta et al. | |
| 2008/0073745 A1 * | 3/2008 | Tang et al. | 257/500 |

FOREIGN PATENT DOCUMENTS

EP 1052775 A2 11/2000

OTHER PUBLICATIONS

Extended European Search Report for European patent appln. No. 12167815.5, 6 pgs. (Jul. 25, 2012).
Gingerich et al., The ISO72x Family of High Speed Digital Isolators, Texas Instruments, pp. 1-11, SLLA198—Jan. 2006.
Developing Reliable Isolation Circuits: When to use a digital isolator vs. an optocoupler, Silicon Laboratories pp. 1-12.

* cited by examiner

*Primary Examiner* — Hoai-An D Nguyen

(57) ABSTRACT

Various exemplary embodiments relate to an isolation device including a semiconductor layer and an insulation layer. The insulation layer insulates a central portion of the semiconductor layer. A high voltage terminal connects to the insulation layer, a first low voltage terminal connects to a first non-insulated portion of the semiconductor layer, and a second low voltage terminal connects to a second non-insulated portion of the semiconductor layer. The first and second low voltage terminals are electrically connected via the semiconductor layer. A voltage applied to the high voltage terminal influences the conductance of the semiconductor layer. The high voltage terminal is galvanically isolated from the first and second low voltage terminals.

20 Claims, 13 Drawing Sheets

GALVANIC ISOLATION DEVICE AND METHOD

TECHNICAL FIELD

Various exemplary embodiments disclosed herein relate generally to galvanic isolation devices and methods.

BACKGROUND

Galvanic isolation is a technique for isolating portions of electrical systems. Electrical current is prevented from moving directly from one portion of the electrical system to another portion. Energy or information may still be exchanged between the portions of the electrical system by using, for example, capacitive coupling, inductive coupling, magnetic coupling, optical coupling, and radio frequency coupling.

Galvanic isolation may be used in situations where two or more electric circuits need to communicate, but the voltage and/or current in at least one of the circuits is at levels that may be hazardous to the other circuits.

SUMMARY

A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to an isolation device including: a semiconductor layer; an insulation layer, wherein the insulation layer insulates a central portion of the semiconductor layer; a high voltage terminal connected to the insulation layer; a first low voltage terminal connected to a first non-insulated portion of the semiconductor layer; and a second low voltage terminal connected to a second non-insulated portion of the semiconductor layer, wherein the first and second low voltage terminals are electrically connected via the semiconductor layer, and wherein a voltage applied to the high voltage terminal influences the conductance of the semiconductor layer.

Various exemplary embodiments further relate to a method for isolating electrical systems, including: applying a first voltage to a high voltage terminal of an isolation device, wherein the first voltage includes an information signal; connecting a first low voltage terminal of the isolation device to a second voltage potential; connecting a second low voltage terminal of the isolation device to a third voltage potential; and obtaining information from the information signal by measuring at least one of a voltage, a current, a resistance, and a conductance at the first and second low voltage terminals, wherein the first voltage influences the conductance of a semiconductor layer of the isolation device.

Various exemplary embodiments further relate to a method for manufacturing an isolation device, including: insulating a central portion of a semiconductor layer with an insulation layer; connecting a high voltage terminal to the insulation layer; connecting a first low voltage terminal to a first non-insulated portion of the semiconductor layer; and connecting a second low voltage terminal to a second non-insulated portion of the semiconductor layer, wherein the first and second low voltage terminals are electrically connected via the semi- conductor layer, and wherein a voltage applied to the high voltage terminal influences the conductance of the semiconductor layer.

In some embodiments, the high voltage terminal is galvanically isolated from the first and second low voltage terminals. In some embodiments, the semiconductor layer is a n-type semiconductor. In some embodiments, the semiconductor layer is a p-type semiconductor. In some embodiments, the non-insulated portions of the semiconductor layer are doped with more dopant than the central portion of the semiconductor layer. In some embodiments, the voltage applied to the high voltage terminal and the conductance of the semiconductor layer have a substantially linear relationship. In some embodiments, the voltage applied to the high voltage terminal is greater than 100 volts.

BRIEF DESCRIPTION OF THE DRAWINGS

In order to better understand various exemplary embodiments, reference is made to the accompanying drawings, wherein.

DETAILED DESCRIPTION

Figure 1:
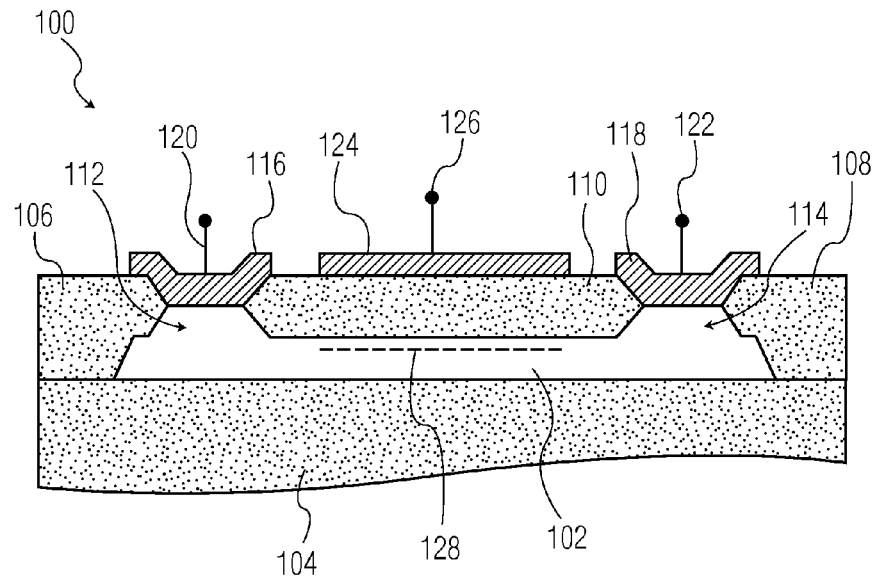
FIG. 1 illustrates a cross-sectional view of an embodiment of a silicon-on-insulator (SOI) isolation device.

Referring now to the drawings, in which like numerals refer to like components or steps, there are disclosed broad aspects of various exemplary embodiments. It should be appreciated by those skilled in the art that any block diagrams herein represent conceptual views of illustrative circuitry embodying the principals of the invention.

According to the foregoing, various exemplary embodiments may provide for galvanic isolation. Information may be transferred across an isolating barrier, while input and output terminals are kept galvanically isolated.

Previous galvanic isolation methods, such as, for example, capacitive coupling, inductive coupling, magnetic coupling, optical coupling, and radio frequency coupling suffer from various disadvantages. For example, the frequency of a signal carrying the information may have a limited bandwidth, and/or the voltage level at the input terminal may have a limited range.

Various embodiments of the present invention may provide galvanic isolation with improved bandwidth (including DC signals), improved voltage range, and/or compact design, among other additional benefits.

FIG. 1 illustrates a cross-sectional view of an embodiment of a silicon-on-insulator (SOI) isolation device 100. An active silicon layer 102 may be isolated from bulk silicon (not shown) by a silicon oxide layer 104. The thickness of the silicon oxide layer 104 may vary. The active silicon layer 102 may by surrounded by a first oxide isolator 106 and a second oxide isolator 108. A high voltage isolation oxide 110 may be above the active silicon layer 102, forming a first active silicon channel 112 between the first oxide isolator 106 and the high voltage isolation oxide 110, and a second active silicon channel 114 between the second oxide isolator 108 and the high voltage isolation oxide 110. A first low voltage metallization layer 116 may be above the first active silicon channel 112, and a second low voltage metallization layer 118 may be above the second active silicon channel 114. The first low voltage metallization layer 116 may form a first low voltage terminal 120, and the second low voltage metallization layer 118 may form a second low voltage terminal 122. A high voltage metallization layer 124 may be above the high voltage isolation oxide 110. The high voltage metallization layer 124 may form a high voltage terminal 126.

The active silicon layer 102 may be implemented with other semiconductor materials that have a sufficiently low number of generation/recombination centra, such as, for example, germanium. The silicon oxide layer 104, the first oxide isolator 106, the second oxide isolator 108, and the high voltage isolation oxide 110 may be implemented with various other dielectric materials, such as, for example, silicon oxide, silicon nitride, and/or silicon oxide with some nitrogen content. The first oxide isolator 106, the second oxide isolator 108, and the high voltage isolation oxide 110 may be formed from the same material. The first oxide isolator 106 and the second oxide isolator 108 may join to surround the active silicon layer 102 when viewed from above. The first oxide isolator 106 and the second oxide isolator 108 may also join with the high voltage isolation oxide 110 when viewed from above.

The high voltage oxide 110 may galvanically isolate the high voltage terminal 126 from the first and second low voltage terminals 120 and 122. The maximum voltage that may be applied to the high voltage terminal 126 while maintaining galvanic isolation may be determined by the thickness and material characteristics of the high voltage oxide 110.

The active silicon layer 102 may be doped with one type of impurity, either n-type or p-type. The charge carriers in the active silicon layer 102 may be electrons for donor impurities such as Arsenic and Phosphorus, or holes for acceptor impurities such as Boron and Indium.

When no voltage is applied to the high voltage terminal 126, the conductance of the device 100, as measured between the first low voltage terminal 120 and second low voltage terminal 122, may be $G_0 = q_e \mu N W t_{si}/L$, where $q_e$ is the electron charge, $\mu$ is the mobility of the charge carriers in the active silicon layer 102, N is the concentration of the charge carriers, W is the width of the device 100 (i.e. the direction perpendicular to the cross-section shown in FIG. 1), $t_{si}$ is the thickness of the active silicon layer 102, and L is the length between the first low voltage terminal 120 and the second low voltage terminal 122.

When a voltage is applied to the high voltage terminal 126, the amount of charge carriers in a region 128 under the high voltage isolation oxide 110 may be modulated by the applied voltage. Therefore, the high voltage terminal 126 may influence the conductance of the device 100.

If the active silicon layer 102 is doped with donor impurities, a positive voltage applied to the high voltage terminal 126 may increase the charge concentration in the region 128 under the high voltage isolation oxide 110. The charge concentration may be measured by $\Delta Q = C_{HV} V_{HV}$, where $C_{HV}$ is the capacitance of the high voltage isolation oxide 110 and $V_{HV}$ is the voltage applied to the high voltage terminal 126. The capacitance $C_{HV} = W L e_0 e_r/t_{ox}$, where W is the width of the high voltage metallization layer 124, L is the length of the high voltage metallization layer 124, $e_0$ is the dielectric permittivity of a vacuum, $e_r$ is the relative dielectric permittivity of the high voltage oxide 110, and $t_{ox}$ is the thickness of the high voltage oxide 110. As a result, the conductance of the device 100 may linearly increase as the charge concentration increases. When a negative voltage is applied to the high voltage terminal 126, the active silicon layer 102 may deplete of charge carriers in the region 128 under the high voltage isolation oxide 110, and the conductance of the device 100 may linearly decrease.

If the active silicon layer 102 is doped with acceptor impurities, a positive voltage applied to the high voltage terminal 126 may decrease the conductance of the device 100, and a negative voltage applied to the high voltage terminal 126 may increase the conductance of the device 100.

The charge accumulation or depletion in the region 128 of the active silicon layer 102 may be brought about by a vertical electric field created across the high voltage isolation oxide 110 by the voltage applied to the high voltage terminal 126.

If the active silicon layer 102 is uniformly doped in both lateral directions, the current between the first low voltage terminal 120 and the second low voltage terminal 122 may be $I = G_0 V_{LV} (1 + \alpha V_{HV})/(1 + R G_0 (1 + \alpha V_{HV}))$, where $V_{LV}$ is the potential difference between the first low voltage terminal 120 and the second low voltage terminal 122, $V_{HV}$ is the voltage applied to the high voltage terminal 126, $G_0 = q_e \mu N W t_{si}/L$, and $\alpha = \mu R_{sh} C_{HV}$, where $R_{sh} = 1/(q_e \mu N t_{si})$. The value R is proportional to the resistance in the active silicon layer 102 over the length $L_R$, where $L_R$ is the difference between L (the length between the first low voltage terminal 120 and the second low voltage terminal 122) and $L_{HV}$ (the length of the high voltage metallization layer 124), as shown in FIG. 2.

Figure 2:
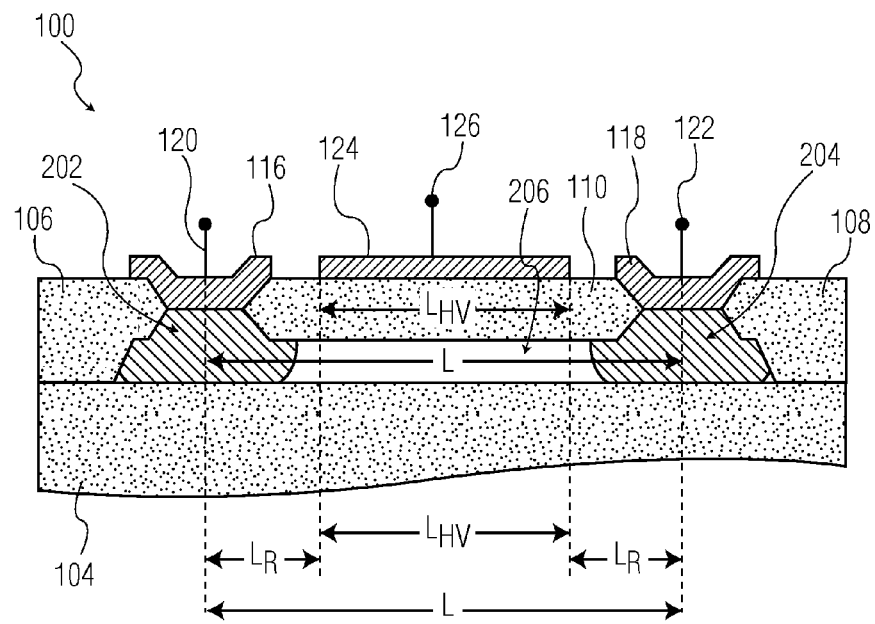
FIG. 2 illustrates an alternative cross-sectional view of an embodiment of a SOI isolation device.

FIG. 2 illustrates an alternative cross-sectional view of the embodiment of the SOI isolation device 100. As shown in FIG. 2, the active silicon layer 102 of FIG. 1 may include a first low voltage active silicon region 202, a second low voltage active silicon region 204, and an active silicon region 206. Similar to FIG. 1, the device 100 includes a silicon oxide layer 104, a first oxide isolator 106, a second oxide isolator 108, a high voltage isolation oxide 110, a first low voltage metallization layer 116, a second low voltage metallization layer 118, a first low voltage terminal 120, a second low voltage terminal 122, a high voltage metallization layer 124, and a high voltage terminal 126.

The value R, described previously, may not be influenced by the voltage applied to the high voltage terminal 126. Therefore, the value R may affect the linearity of the relationship between the current I and the voltage applied to the high voltage terminal 126. The contribution of the value R to the total current I may be reduced by doping a first low voltage active silicon region 202 and a second low voltage active silicon region 204 with a higher amount of dopant than an active silicon region 206 under the high voltage isolation oxide 110, as shown in FIG. 2. The high doping concentration in the low voltage active silicon regions 202 and 204 may allow the resistance in those regions to be negligible, making the value R sufficiently small to be negligible. Therefore, the current between the first low voltage terminal 120 and the second low voltage terminal 122 may be approximated as $I=G_0V_{LV}(1+\alpha V_{HV})$, or equivalently $G=G_0(1+\alpha V_{HV})$, where G is the conductance of the device 100 when a voltage is applied to the high voltage terminal 126.

Figure 3:
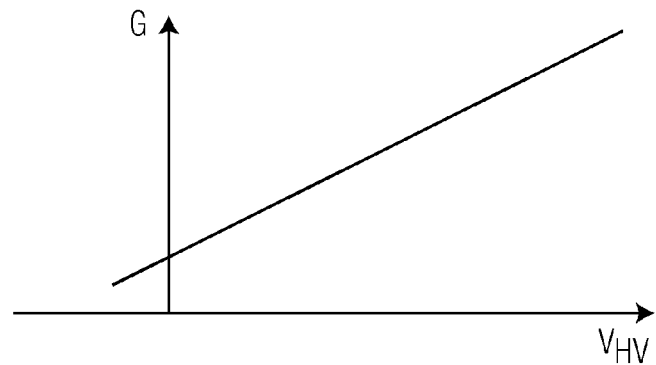
FIG. 3 illustrates an approximation of a relationship between conductance and voltage.

An approximation of the linear relationship between the conductance G and voltage $V_{HV}$ at the high voltage terminal 126 is shown in FIG. 3. The relationship between the conductance G and the voltage $V_{HV}$ may allow information to be transferred from the high voltage terminal 126 to the first and second low voltage terminals 120 and 122 while keeping the terminals galvanically isolated.

Figure 4:
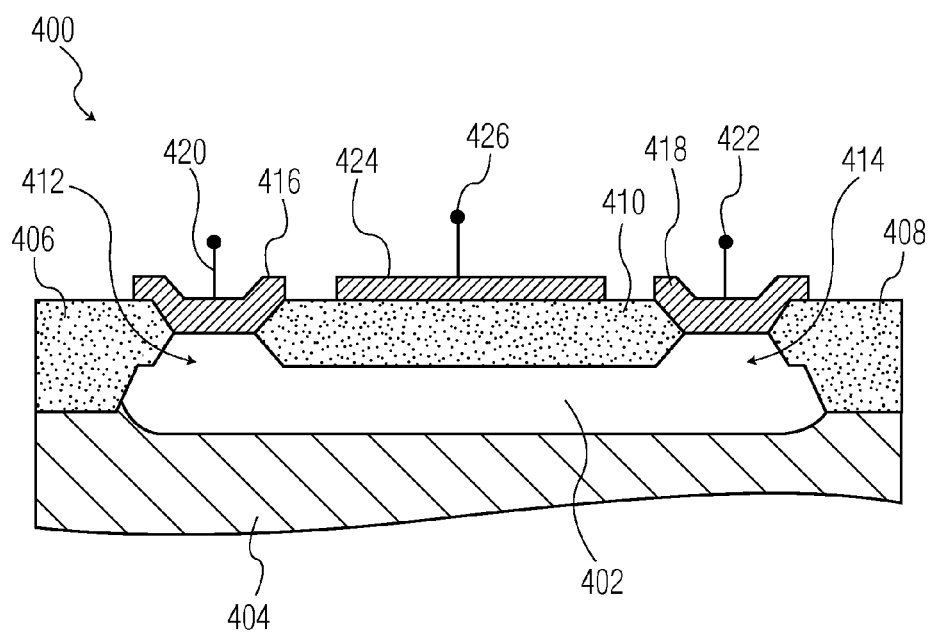
FIG. 4 illustrates an embodiment of a bulk silicon isolation device.

FIG. 4 illustrates an embodiment of a bulk silicon isolation device 400. In this embodiment, an n-type active silicon layer 402 may be above a p-type bulk silicon substrate 404 without an intermediate oxide layer. The n-type active silicon layer 402 may by surrounded by a first oxide isolator 406 and a second oxide isolator 408. A high voltage isolation oxide 410 may be above the n-type active silicon layer 402, forming a first active silicon channel 412 between the first oxide isolator 406 and the high voltage isolation oxide 410, and a second active silicon channel 414 between the second oxide isolator 408 and the high voltage isolation oxide 410. A first low voltage metallization layer 416 may be above the first active silicon channel 412, and a second low voltage metallization layer 418 may be above the second active silicon channel 414. The first low voltage metallization layer 416 may form a first low voltage terminal 420, and the second low voltage metallization layer 418 may form a second low voltage terminal 422. A high voltage metallization layer 424 may be above the high voltage isolation oxide 410. The high voltage metallization layer 424 may form a high voltage terminal 426.

The active silicon layer 402 and bulk silicon substrate 404 may be implemented with other semiconductor materials, such as, for example, germanium. The first oxide isolator 406, the second oxide isolator 408, and the high voltage isolation oxide 410 may be implemented with various other dielectric materials, such as, for example, silicon oxide, silicon nitride, and/or silicon oxide with some nitrogen content. The first oxide isolator 406, the second oxide isolator 408, and the high voltage isolation oxide 410 may be formed from the same material. The first oxide isolator 406 and the second oxide isolator 408 may join to surround the active silicon layer 402 when viewed from above. The first oxide isolator 406 and the second oxide isolator 408 may also join with the high voltage isolation oxide 410 when viewed from above.

The high voltage oxide 410 may galvanically isolate the high voltage terminal 126 from the first and second low voltage terminals 420 and 422. The maximum voltage that may be applied to the high voltage terminal 426 while maintaining galvanic isolation may be determined by the thickness and material characteristics of the high voltage oxide 410.

The device 400 may operate similarly to the device 100 shown in FIGS. 1 and 2, provided that the potential in the n-type active silicon layer 402 is higher than the potential of the p-type bulk silicon substrate 404. For example, if the p-type bulk silicon substrate 404 is kept at a ground potential, then positive potentials may be applied to the first low voltage terminal 420 and the second low voltage terminal 422.

The regions of the n-type active silicon layer 402 below the first and second low voltage metallization layers 416 and 418 may be doped with a higher amount of dopant than the region under the high voltage isolation oxide 410, similar to FIG. 2. The conductance of the device 400 may have an approximately linear relationship to the voltage applied to the high voltage terminal 426 when a higher amount of dopant is used in those regions.

Figure 5:
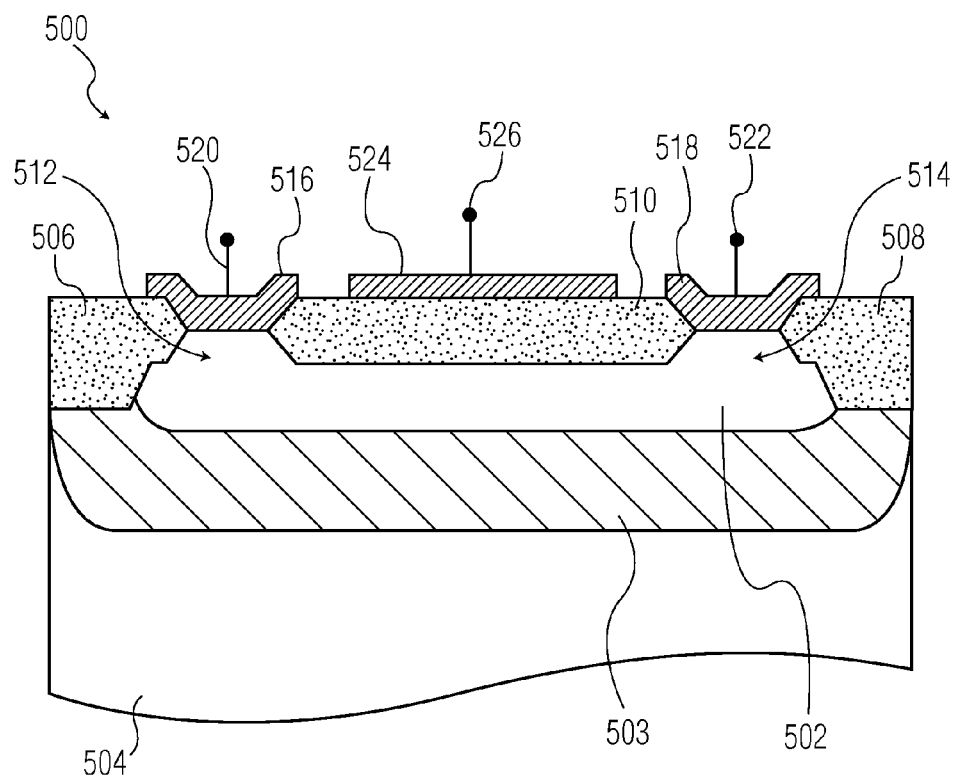
FIG. 5 illustrates an alternative embodiment of a bulk silicon isolation device.

FIG. 5 illustrates an alternative embodiment of a bulk silicon isolation device 500. In this embodiment a p-type active silicon layer 502 may be above a p-type bulk silicon substrate 504, with a buried n-type well 503 between the substrate 504 and the active silicon 502. The p-type active silicon layer 502 may by surrounded by a first oxide isolator 506 and a second oxide isolator 508. A high voltage isolation oxide 510 may be above the p-type active silicon layer 502, forming a first active silicon channel 512 between the first oxide isolator 506 and the high voltage isolation oxide 510, and a second active silicon channel 514 between the second oxide isolator 508 and the high voltage isolation oxide 510. A first low voltage metallization layer 516 may be above the first active silicon channel 512, and a second low voltage metallization layer 518 may be above the second active silicon channel 514. The first low voltage metallization layer 516 may form a first low voltage terminal 520, and the second low voltage metallization layer 518 may form a second low voltage terminal 522. A high voltage metallization layer 524 may be above the high voltage isolation oxide 510. The high voltage metallization layer 524 may form a high voltage terminal 526.

The active silicon layer 502, well 503, and silicon substrate 504 may be implemented with other semiconductor materials, such as, for example, germanium. The first oxide isolator 506, the second oxide isolator 508, and the high voltage isolation oxide 510 may be implemented with various other dielectric materials, such as, for example, silicon oxide, silicon nitride, and/or silicon oxide with some nitrogen content. The first oxide isolator 506, the second oxide isolator 508, and the high voltage isolation oxide 510 may be formed from the same material. The first oxide isolator 506 and the second oxide isolator 508 may join to surround the active silicon layer 502 when viewed from above. The first oxide isolator 506 and the second oxide isolator 508 may also join with the high voltage isolation oxide 510 when viewed from above.

The high voltage oxide 510 may galvanically isolate the high voltage terminal 526 from the first and second low voltage terminals 520 and 522. The maximum voltage that may be applied to the high voltage terminal 526 while maintaining galvanic isolation may be determined by the thickness and material characteristics of the high voltage oxide 510.

The device 500 may operate similarly to the device 100 shown in FIGS. 1 and 2. If positive potentials are applied to the first and second low voltage terminals 520 and 522, the buried n-type well 503 may be biased to a voltage level equal to or greater than the higher of the two positive potentials to ensure a reverse bias with the p-type bulk silicon substrate 504, provided the substrate 504 is at ground potential. The reverse bias may prevent significant leakage between the p-type active silicon layer 502, the p-type bulk silicon substrate 504, and the buried n-type well 503.

The regions of the p-type active silicon layer 502 below the first and second low voltage metallization layers 516 and 518 may be doped with a higher amount of dopant than the region under the high voltage isolation oxide 510, similar to FIG. 2. The conductance of the device 500 may have an approximately linear relationship to the voltage applied to the high voltage terminal 526 when a higher amount of dopant is used in those regions.

Figure 6:
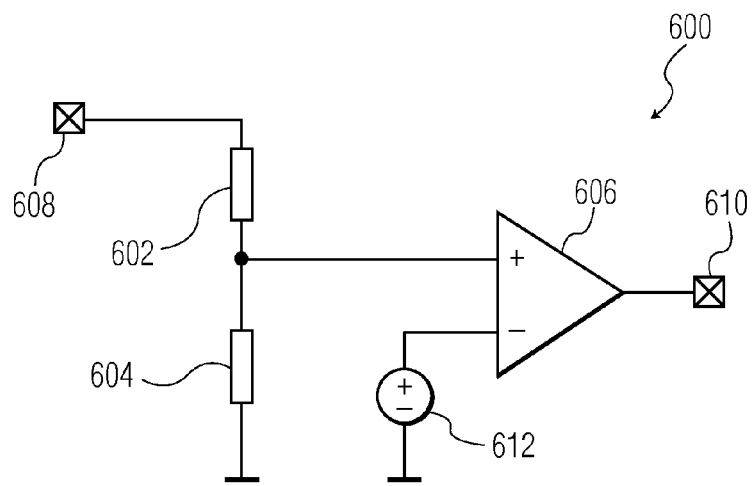
FIG. 6 illustrates a conventional buffer circuit.

FIG. 6 illustrates a conventional buffer circuit 600 that may be used to accommodate high voltages. The circuit may include a first resistor 602, a second resistor 604, an amplifier 606, a high voltage input node 608, an output node 610, and a reference voltage source 612. The first resistor 602 and the second resistor 604 may form a voltage divider, and may decrease the voltage input into the amplifier 606. The voltage at the positive input terminal of the amplifier 606 may be defined as $V^+ = V_{HV} R_{i2}/(R_{i1}+R_{i2})$, where $V_{HV}$ is the voltage input at node 608, $R_{i1}$ is the resistance of resistor 602, and $R_{i2}$ is the resistance of resistor 604. The first and second resistors 602 and 604 may have large resistances in order to reduce the current (where $I=V_{HV}/(R_{i1}+R_{i2})$), and therefore the peak dissipation, of the circuit 600. However, resistors with large resistance values may consume a significant area of the buffer circuit 600. Therefore, it may be difficult to implement the buffer circuit 600 to have both low power consumption and small circuit area.

Figure 7:
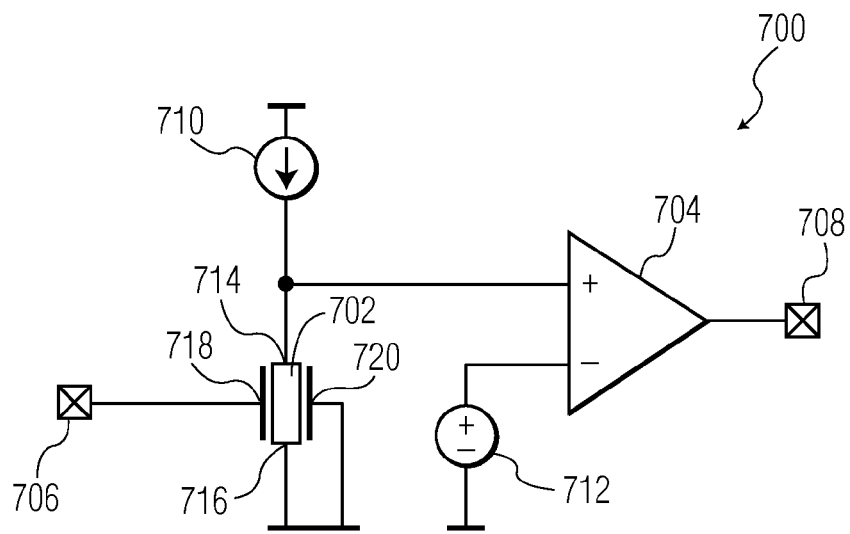
FIG. 7 illustrates an example of a high voltage buffer circuit.

FIG. 7 illustrates an example of a high voltage buffer circuit 700 that utilizes an embodiment of the present invention. The circuit 700 may include an isolation device 702, an amplifier 704, a high voltage input node 706, an output node 708, a reference current source 710, and a reference voltage source 712. The reference current source 710 may be connected to a first low voltage terminal 714 of the isolation device 702. A second low voltage terminal 716 of the isolation device 702 may be connected to ground. The high voltage input node may be connected to a high voltage terminal 718 of the isolation device 702. A bulk silicon node 720 of the isolation device 702 may be connected to ground.

The isolation device 702 may galvanically isolate the high voltage input node 706 from the remainder of the circuit 700. However, if a waveform with a high voltage is input at the high voltage input node 706, a substantially similar waveform with a low voltage may be output at the output node 708. As the high voltage waveform modulates, the conductance G of the isolation device 702 may be modulated as well, according to the relationship described above. Because a constant current may be supplied to the first low voltage terminal 714 by the reference current source 710, the voltage at the positive terminal of the amplifier 704 may be modulated by the conductance of the isolation device 702. The voltage modulated by the conductance may then be output by the buffer circuit 700 at a desired voltage level.

The area of the buffer circuit 700 may be significantly smaller than the buffer circuit 600 shown in FIG. 6. The size of the isolation device 702 may be dependent on a desired sensitivity of the device. The sensitivity may determine the voltage range that may be applied to the high voltage terminal 718 of the isolation device 702. The sensitivity may be dependent on the amount of dopant in the active silicon layer and on the dimensions (e.g. width, length, and thickness) of the various components in the isolation device 702.

Figure 8:
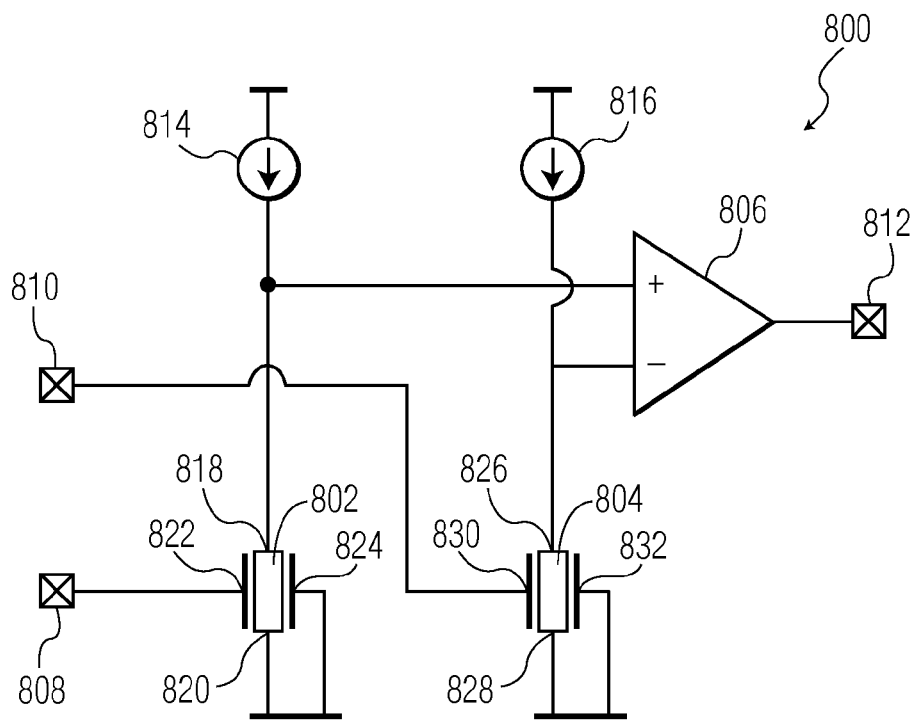
FIG. 8 illustrates an example of a high voltage differential circuit.

FIG. 8 illustrates an example of a differential circuit 800 that utilizes embodiments of the present invention. The circuit may include a first isolation device 802, a second isolation device 804, an amplifier 806, a first high voltage input node 808, a second high voltage input node 810, an output node 812, a first reference current source 814, and a second reference current source 816.

The first reference current source 814 may be connected to a first low voltage terminal 818 of the first isolation device 802. A second low voltage terminal 820 of the first isolation device 802 may be connected to ground. The first high voltage input node 808 may be connected to a high voltage terminal 822 of the first isolation device 802. A bulk silicon node 824 of the first isolation device 802 may be connected to ground.

The second reference current source 816 may be connected to a first low voltage terminal 826 of the second isolation device 804. A second low voltage terminal 828 of the second isolation device 804 may be connected to ground. The second high voltage input node 810 may be connected to a high voltage terminal 830 of the second isolation device 804. A bulk silicon node 832 of the second isolation device 804 may be connected to ground.

The first and second current sources, 814 and 816, may each generate a current I through the isolation devices 802 and 804. A first high voltage $V_{HV}$ may be applied to the first high voltage node 808. A second high voltage $V_{HV}+v_i$ may be applied to the second high voltage node 810. The second high voltage may have a small signal $v_i$ superimposed on $V_{HV}$. The first high voltage $V_{HV}$ may modify the conductance of the first isolation device 802 to be $G_1$. The second high voltage $V_{HV}+v_i$ may modify the conductance of the second isolation device 804 to be $G_2$. The difference in the conductances $G_1$ and $G_2$ may be proportional to the difference between the input voltages, i.e. $v_i$. The voltage output by the amplifier 806 may be $V_o=(1/G_1-1/G_2)I$. Therefore, the output voltage $V_o$ may be proportional to the small signal $v_i$. The high voltage nodes 808 and 810 may be isolated from the output node 812 by the isolation devices 802 and 804.

Figure 9A:
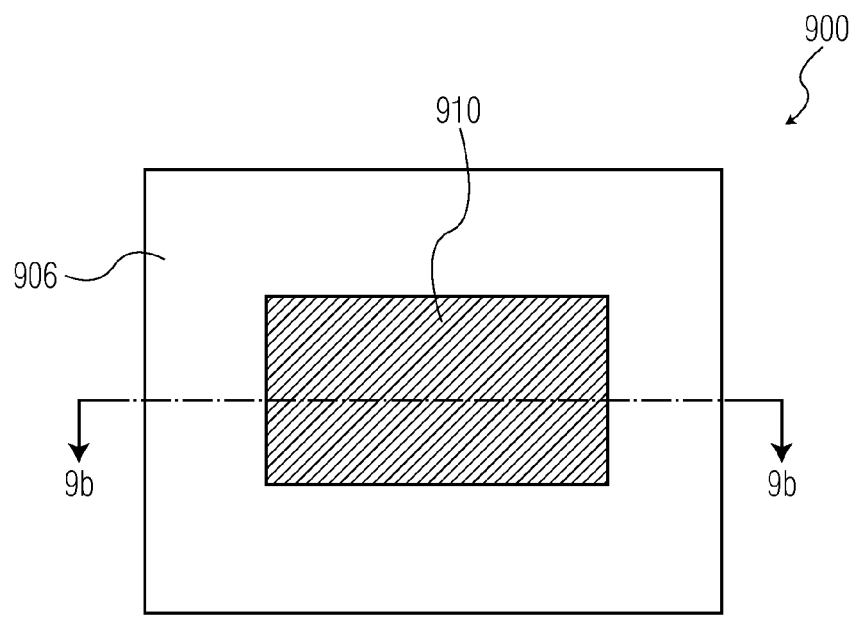
FIG. 9a illustrates a plan view of an embodiment of a isolation device.
Figure 9B:
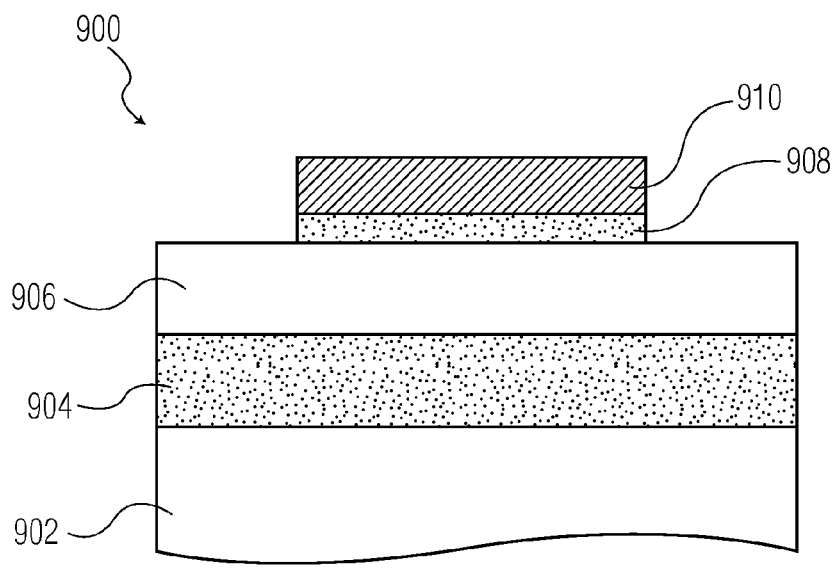
FIG. 9b illustrates a cross-sectional view of the isolation device of FIG. 9a taken along line 9b.

Some embodiments of the present invention may be manufactured using a LOCOS isolation process with a SOI wafer. Various exemplary stages of the manufacturing process are illustrated in FIGS. 9a-9i. FIG. 9a illustrates a plan view of an embodiment of a isolation device 900. At the illustrated stage of manufacturing, the upper surface of the isolation device 900 may include an active Si layer 906 and a SiN hard mask 910. FIG. 9b illustrates a cross-sectional view of the isolation device 900 taken along line 9b. The isolation device 900 may include a Si substrate 902, an insulator layer 904, and an active Si layer 906. A $SiO_2$ sacrificial layer 908 may be thermally grown on the active Si layer 906 of the isolation device 900. The SiN hard mask 910 may then be deposited above the $SiO_2$ sacrificial layer 902. A portion of the SiN hard mask 910 may be protected with a photo resist (not shown), and the remaining portions of SiN may be etched away using photolithography. The portions of SiO2 not covered by the SiN hard mask 910 may be removed using dry and/or wet etching, resulting in the structure shown in FIGS. 9a and 9b.

Figure 9C:
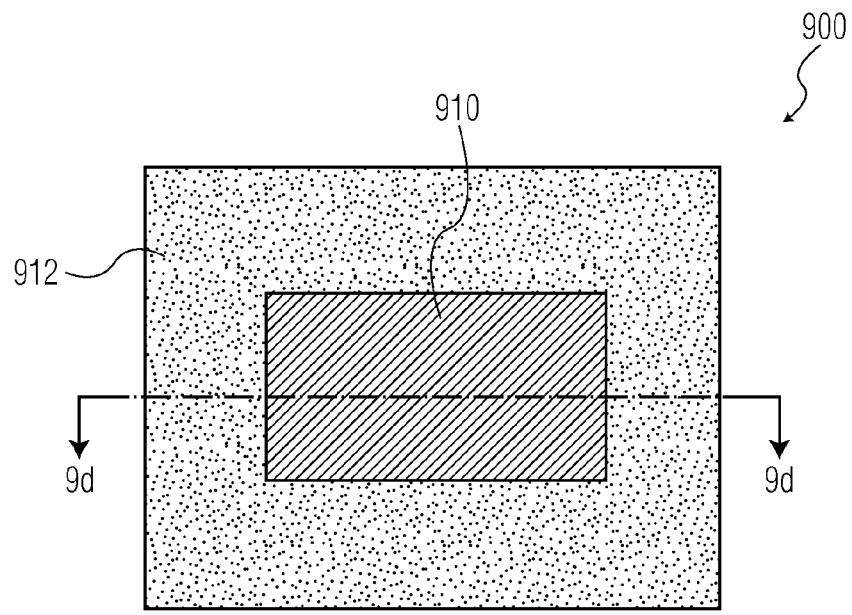
FIG. 9c illustrates a plan view of an isolation device.
Figure 9D:
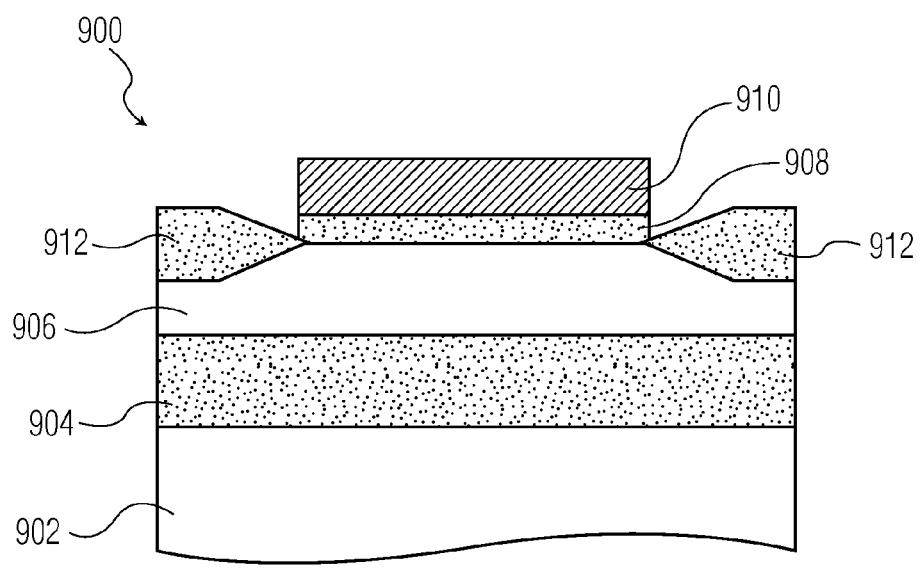
FIG. 9d illustrates a cross-sectional view of the isolation device of FIG. 9c taken along line 9d.

FIG. 9c illustrates another plan view of the isolation device 900. At this stage of manufacturing, the upper surface of the isolation device 900 may include the SiN hard mask 910 and $SiO_2$ isolator 912. FIG. 9d illustrates a cross-sectional view of the isolation device 900 taken along line 9d. The isolation device 900 may include the Si substrate 902, the insulator layer 904, the active Si layer 906, the $SiO_2$ sacrificial layer 908, the SiN hard mask 910, and the $SiO_2$ isolator 912. The $SiO_2$ isolator 912 may be thermally grown above the portions of the active Si layer 906 not covered by the SiN hard mask 910, resulting in the structure shown in FIGS. 9c and 9d.

After this stage, the SiN hard mask 910 may be removed by a wet etch process. The active Si layer 906 may then be doped with, for example, As, P, B, or In. The amount and/or type of doping may be selected based on a desired sensitivity and/or desired application of the isolation device 900. After doping, the surface of the isolation device may be cleaned.

Figure 9E:
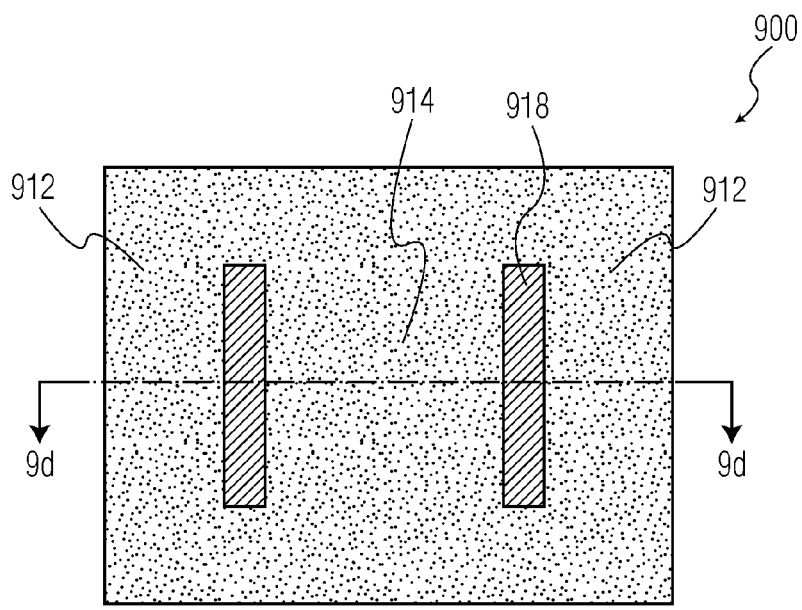
FIG. 9e illustrates a plan view of an isolation device.
Figure 9F:
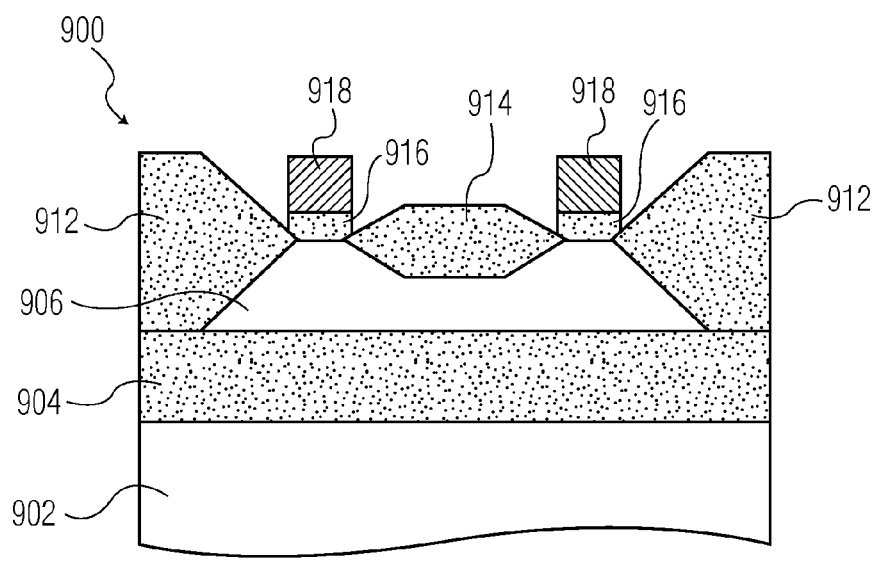
FIG. 9f illustrates a cross-sectional view of the isolation device of FIG. 9e taken along line 9f.

FIG. 9e illustrates another plan view of the isolation device 900. At this stage of manufacturing, the upper surface of the isolation device 900 may include the SiO$_2$ isolator 912, a SiO$_2$ high voltage isolation layer 914, and another SiN hard mask 918. FIG. 9f illustrates a cross-sectional view of the isolation device 900 taken along line 9f. The isolation device 900 may include the Si substrate 902, the insulator layer 904, the active Si layer 906, the SiO$_2$ isolator 912, the SiO$_2$ high voltage isolation layer 914, another SiO$_2$ sacrificial layer 916, and the SiN hard mask 918. After the cleaning step previously described, the SiO$_2$ sacrificial layer 916 may be thermally grown, followed by deposition of the SiN hard mask 918. Portions of SiN may be etched away using photo-lithography, leaving the SiN hard mask 918 shown in FIGS. 9e and 9f. The SiO$_2$ high voltage isolation layer 914 may be grown in the areas not protected by the SiN hard mask 918, and the SiO$_2$ isolator 912 may be grown further, increasing their thickness, resulting in the structure shown in FIGS. 9e and 9f. The two growth steps for the SiO$_2$ isolator 912 (i.e. FIGS. 9d and 9f) may ensure that the active Si layer 906 is fully isolated.

The thickness of the SiO$_2$ high voltage isolation layer 914 may be selected based on a desired high voltage the isolation device 900 may properly work with. If the voltage applied to the high voltage terminals of the isolation device ($V_{HV}$) is much greater than the voltage applied to the low voltage terminals, then the high voltage the isolation device may work with may be determined by $V_{HV}=E_{OX}t_{HV}$, where $E_{OX}$ is the critical electric field of SiO$_2$ (approximately 5-10 MV/cm) and $t_{HV}$ is the thickness of the SiO$_2$ high voltage isolation layer 914.

Figure 9G:
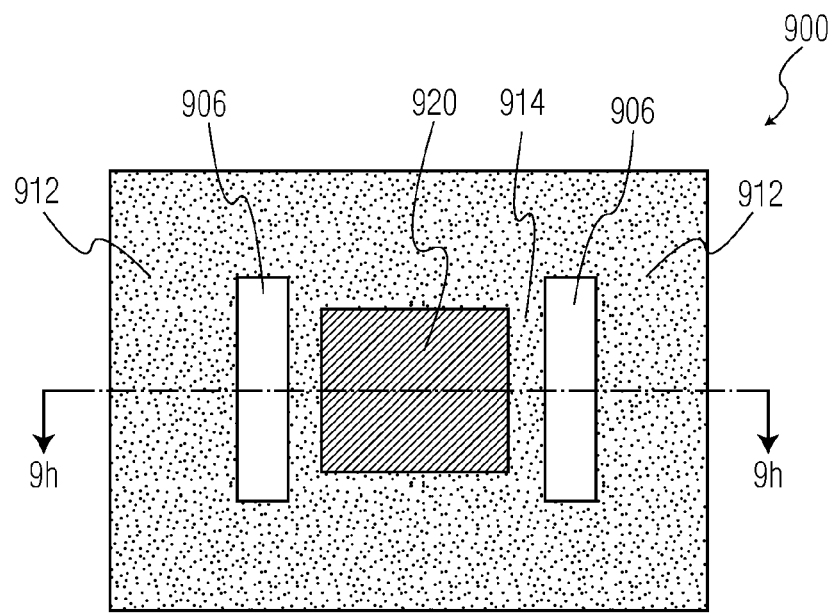
FIG. 9g illustrates a plan view of an isolation device.
Figure 9H:
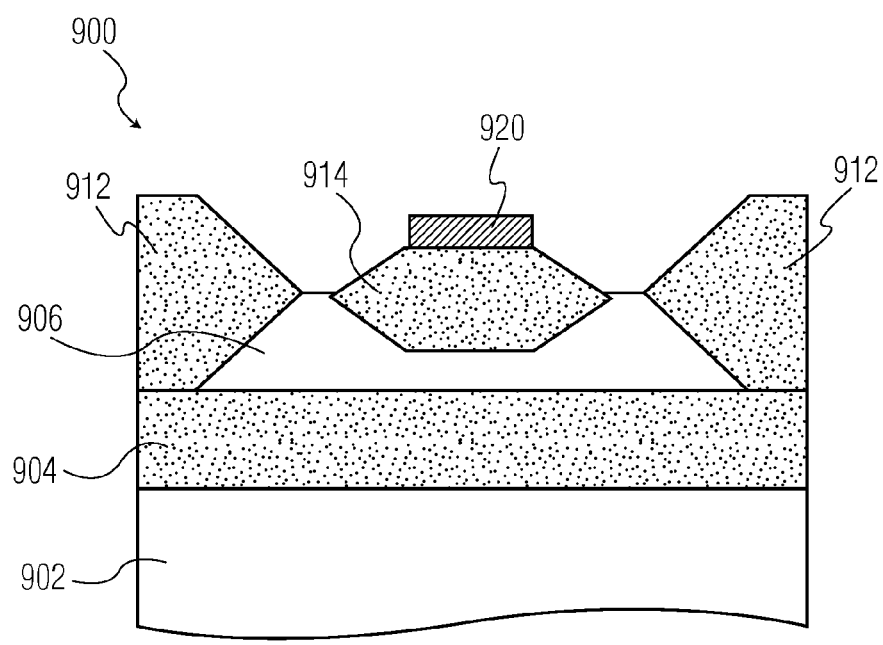
FIG. 9h illustrates a cross-sectional view of the isolation device of FIG. 9g taken along line 9h.

FIG. 9g illustrates another plan view of the isolation device 900. At this stage of manufacturing, the upper surface of the isolation device 900 may include the active Si layer 906, the SiO$_2$ isolator 912, the SiO$_2$ high voltage isolation layer 914, and a poly-Si layer 920. FIG. 9h illustrates a cross-sectional view of the isolation device 900 taken along line 9h. The isolation device 900 may include the Si substrate 902, the insulator layer 904, the active Si layer 906, the SiO$_2$ isolator 912, the SiO$_2$ high voltage isolation layer 914, and the poly-Si layer 920. After removing the SiN hard mask 918 and the SiO$_2$ sacrificial layer 916 shown in FIGS. 9e and 9f, the poly-Si layer 920 may be deposited and etched, resulting in the structure shown in FIGS. 9g and 9h.

At this stage, the exposed portions of the active Si layer 906 may undergo additional doping using the same dopant as previously used. The additional doping may decrease the resistivity of portions of the active Si layer 906. The poly-Si layer 920 may also undergo doping.

Figure 9I:
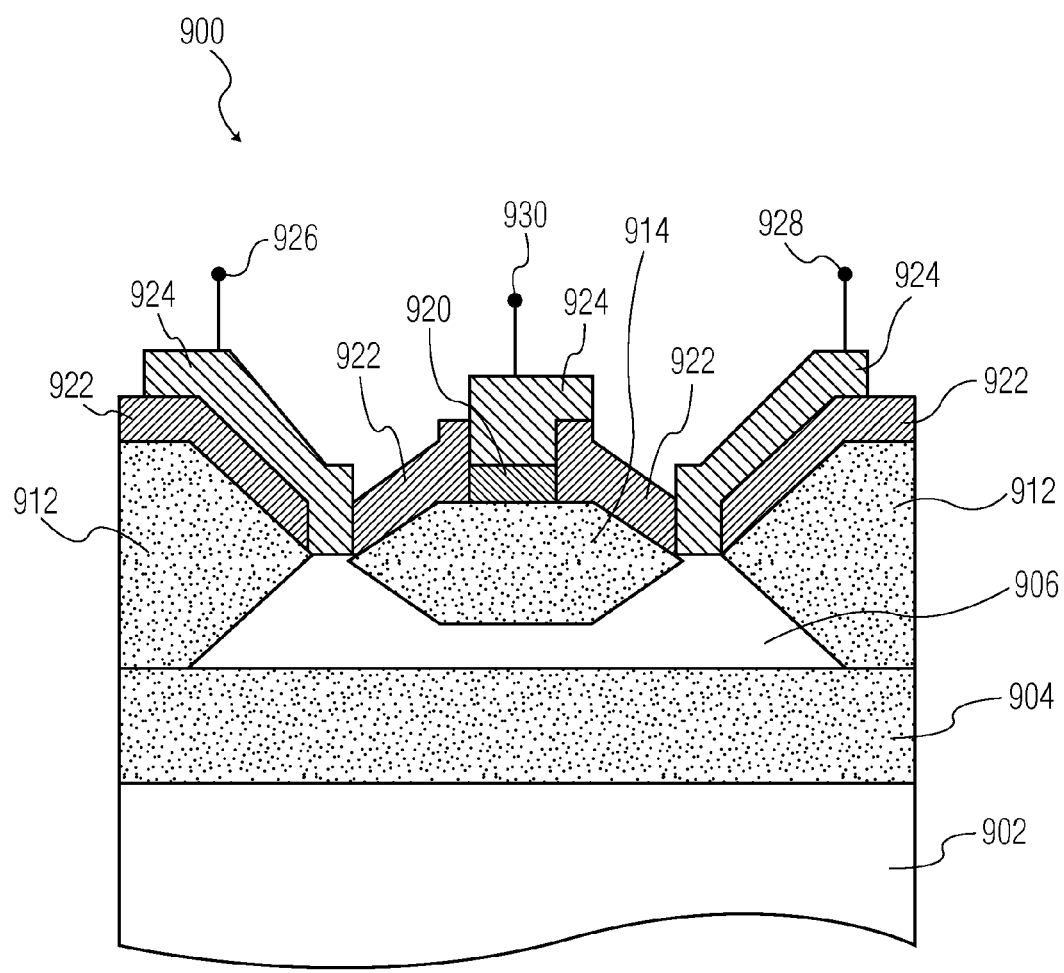
FIG. 9i illustrates a cross-sectional view an embodiment of an isolation device.

FIG. 9i illustrates a cross-sectional view an embodiment of the isolation device 900 at another stage of manufacturing. The isolation device 900 may include the Si substrate 902, the insulator layer 904, the active Si layer 906, the SiO$_2$ isolator 912, the SiO$_2$ high voltage isolation layer 914, the poly-Si layer 920, a dielectric layer 922, and a metallization layer 924. The dielectric layer 922 and metallization layer 924 may be implemented using standard techniques. The metallization layer 924 may connect to the active Si layer 906 and the poly-Si layer 920. The metallization layer 924 may form a first low voltage terminal 926, a second low voltage terminal 928, and a high voltage terminal 930.

In the stages shown and described in FIGS. 9a-9i, the Si substrate 902 and the active Si layer 906 may be implemented with other semiconductor materials, such as, for example, germanium. The insulator layer 904, the SiO$_2$ isolator 912, the SiO$_2$ high voltage isolation layer 914, and the dielectric layer 922 may be implemented with various other dielectric materials, such as, for example, silicon oxide, silicon nitride, and/or silicon oxide with some nitrogen content.

Figure 10:
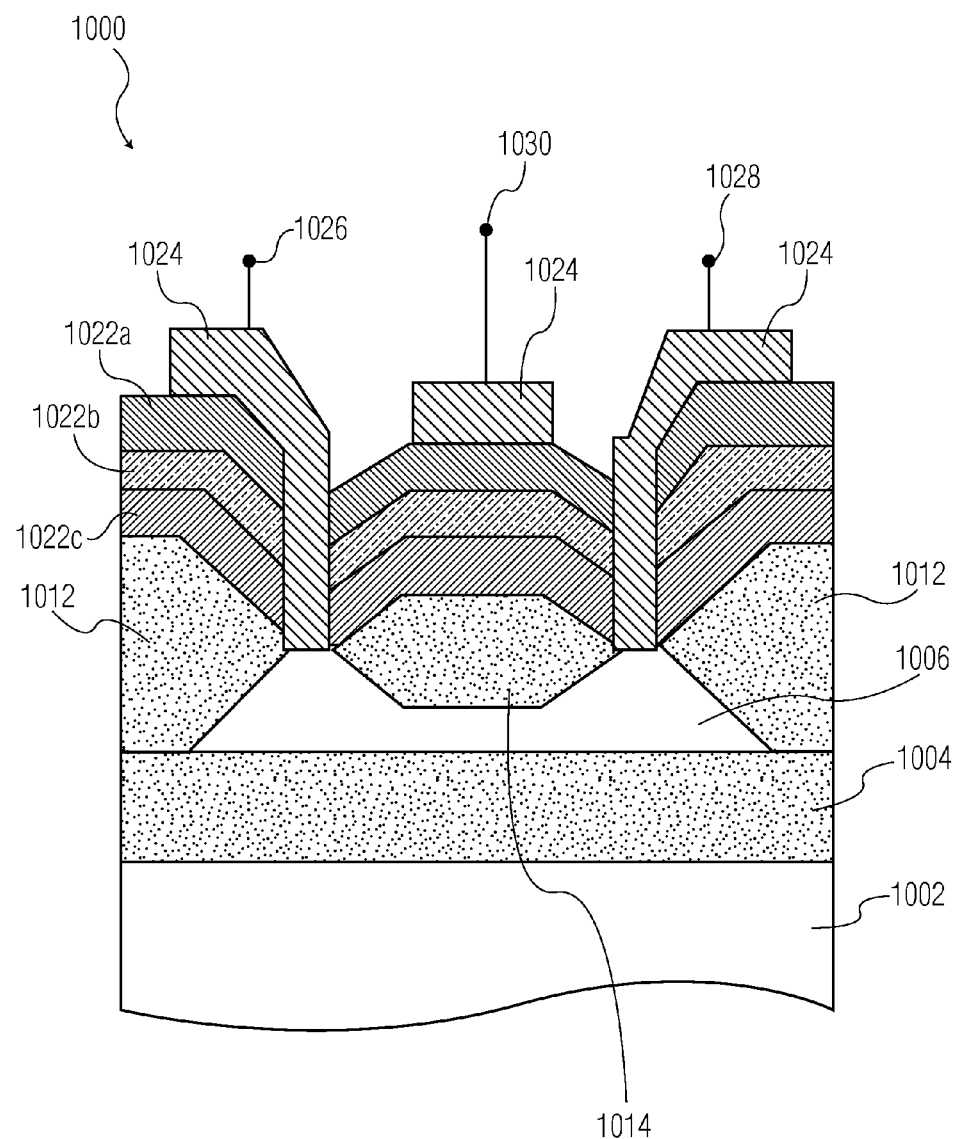
FIG. 10 illustrates an alternative embodiment of an isolation device.

FIG. 10 illustrates an alternative embodiment of an isolation device 1000 that may utilize a manufacturing method similar to what is shown and described in FIGS. 9a-9i. The isolation device 1000 may include a Si substrate 1002, an insulator layer 1004, an active Si layer 1006, SiO$_2$ isolator 1012, a SiO$_2$ high voltage isolation layer 1014, dielectric layers 1022a, 1022b, and 1022c, and a metallization layer 1024. The metallization layer 1024 may form a first low voltage terminal 1026, a second low voltage terminal 1028, and a high voltage terminal 1030.

The Si substrate 1002 and the active Si layer 1006 may be implemented with other semiconductor materials, such as, for example, germanium. The insulator layer 1004, the SiO$_2$ isolator 1012, the SiO$_2$ high voltage isolation layer 1014, and the dielectric layers 1022a, 1022b, and 1022c may be implemented with various other dielectric materials, such as, for example, silicon oxide, silicon nitride, and/or silicon oxide with some nitrogen content.

The dielectric layers 1022a, 1022b, and 1022c may allow the isolation device 1000 to be manufactured more efficiently with other semiconductor devices, and may improve the isolation of the active Si layer 1006. The thickness and material characteristics of the dielectric layers 1022a, 1022b, and 1022c, in addition to the thickness and material characteristics of the SiO$_2$ high voltage isolation layer 1014, may affect the high voltage the isolation device 1000 may work with. Therefore, the isolation device 1000 may be designed to work with higher voltages than the isolation device 900 shown in FIGS. 9a-9i. In some embodiments, the voltage applied to the high voltage terminal 1030 may exceed 1000 volts.

Figure 11A:
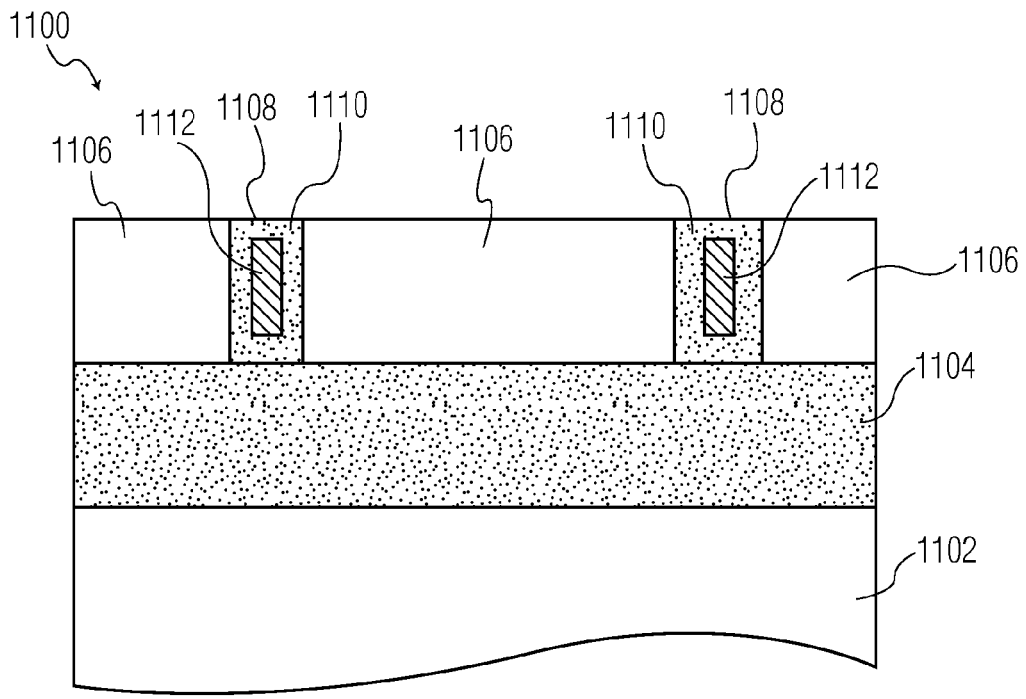
FIG. 11a illustrates a cross-sectional view of an isolation device.
Figure 11B:
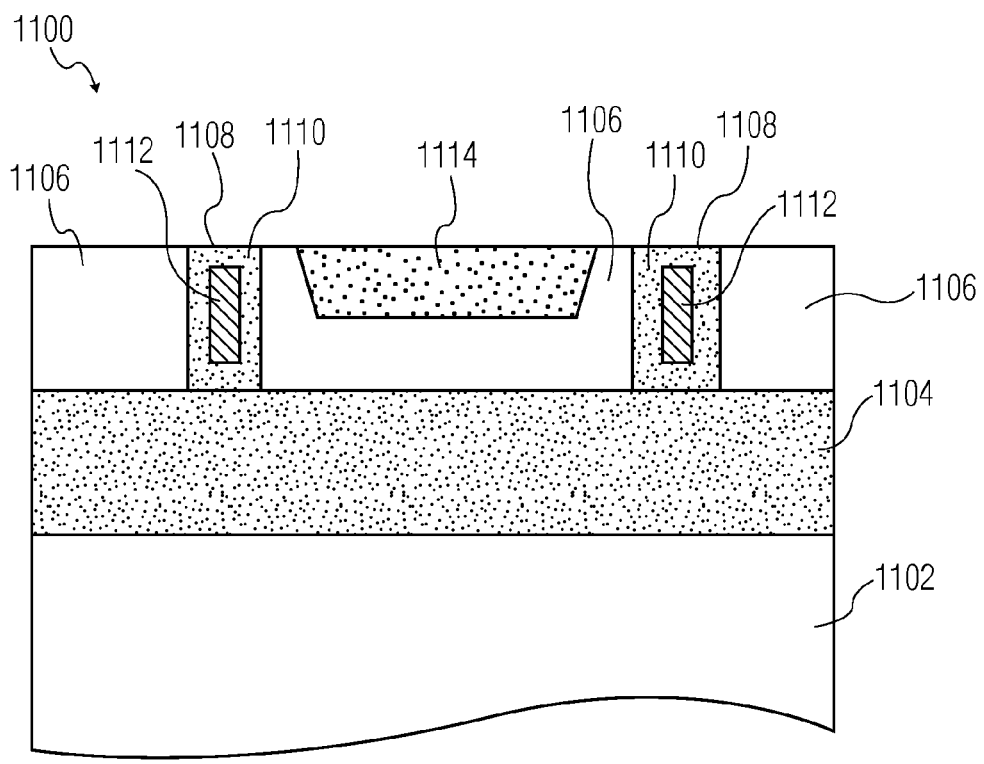
FIG. 11b illustrates a cross-sectional view of an isolation device.
Figure 11C:
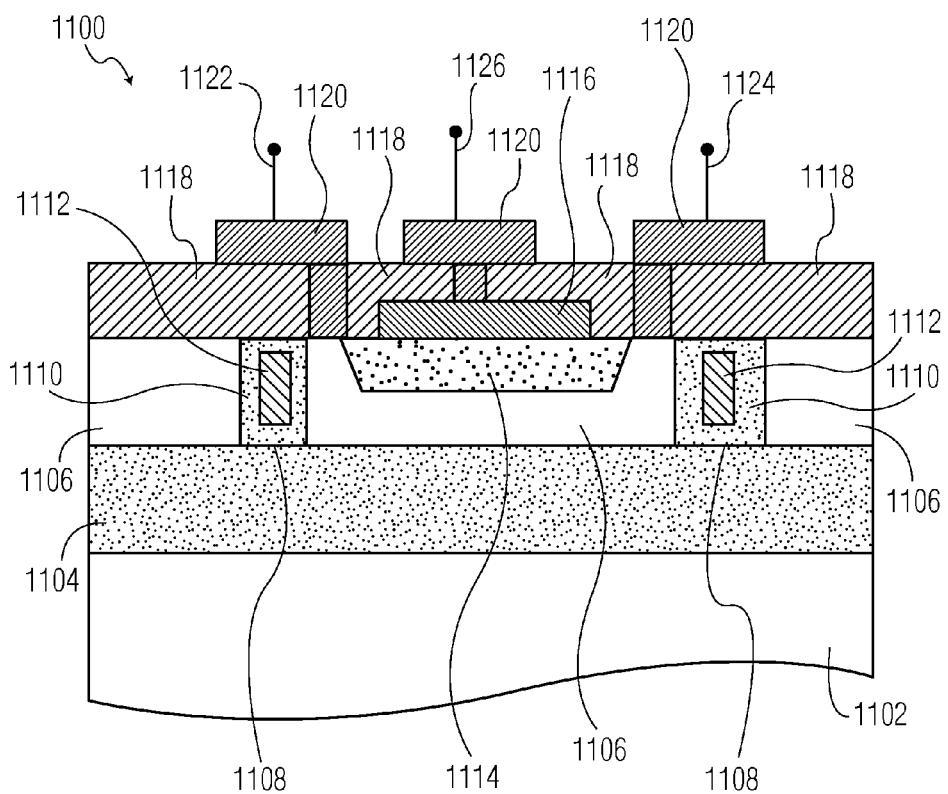
FIG. 11c illustrates a cross-sectional view of an isolation device.

Some embodiments of the present invention may be manufactured using a shallow trench isolation (STI) process with a SOI wafer. Various exemplary stages of the manufacturing process are illustrated in FIGS. 11a-11c. FIG. 11a illustrates a cross-sectional view of an isolation device 1100. The isolation device 1100 may include a Si substrate 1102, an insulator layer 1104, an active Si layer 1106, and medium trench isolators 1108. The medium trench isolators 1108 may include a SiO$_2$ portion 1110 and a poly-Si portion 1112. The medium trench isolators 1108 may isolate a portion of the active Si layer 1106. The isolated portion of the active Si layer 1106 may be doped with, for example, As, P, B, or In. The amount and/or type of doping may be selected based on a desired sensitivity and/or desired application of the isolation device 1100.

FIG. 11b illustrates a cross-sectional view of the isolation device 1100 at another stage of manufacturing. The isolation device 1100 may include the Si substrate 1102, the insulator layer 1104, the active Si layer 1106, the medium trench isolators 1108, and a shallow trench isolator 1114. The medium trench isolators 1108 may include a SiO$_2$ portion 1110 and a poly-Si portion 1112. The shallow trench isolator 1114 may be implemented using standard techniques in the active Si layer 1106 between the two medium trench isolators 1108.

FIG. 11c illustrates a cross-sectional view of the isolation device 1100 at another stage of manufacturing. The isolation device 1100 may include the Si substrate 1102, the insulator layer 1104, the active Si layer 1106, the medium trench isolators 1108, the shallow trench isolator 1114, a poly-Si layer 1116, a dielectric layer 1118, and a metallization layer 1120. The medium trench isolators 1108 may include a SiO$_2$ portion 1110 and a poly-Si portion 1112. The poly-Si layer 1116 may be deposited and patterned using photo-lithography. The dielectric layer 1118 and metallization layer 1120 may be implemented using standard techniques. The metallization layer 1120 may connect to the active Si layer 1106 and the poly-Si layer 1116. The metallization layer 1120 may form a first low voltage terminal 1122, a second low voltage terminal 1124, and a high voltage terminal 1126.

Prior to growing the SiO$_2$ isolation layer 1118, the exposed portions of the active Si layer 1106 may undergo additional doping using the same dopant as previously used. The additional doping may decrease the resistivity of portions of the active Si layer 1106. The poly-Si layer 1116 may also undergo doping.

In the stages shown and described in FIGS. 11a-11c, the Si substrate 1102 and the active Si layer 1106 may be implemented with other semiconductor materials, such as, for example, germanium. The insulator layer 1104, the medium trench isolators 1108, the shallow trench isolator 1114, and the dielectric layer 1118, may be implemented with various other dielectric materials, such as, for example, silicon oxide, silicon nitride, and/or silicon oxide with some nitrogen content.

Figure 12:
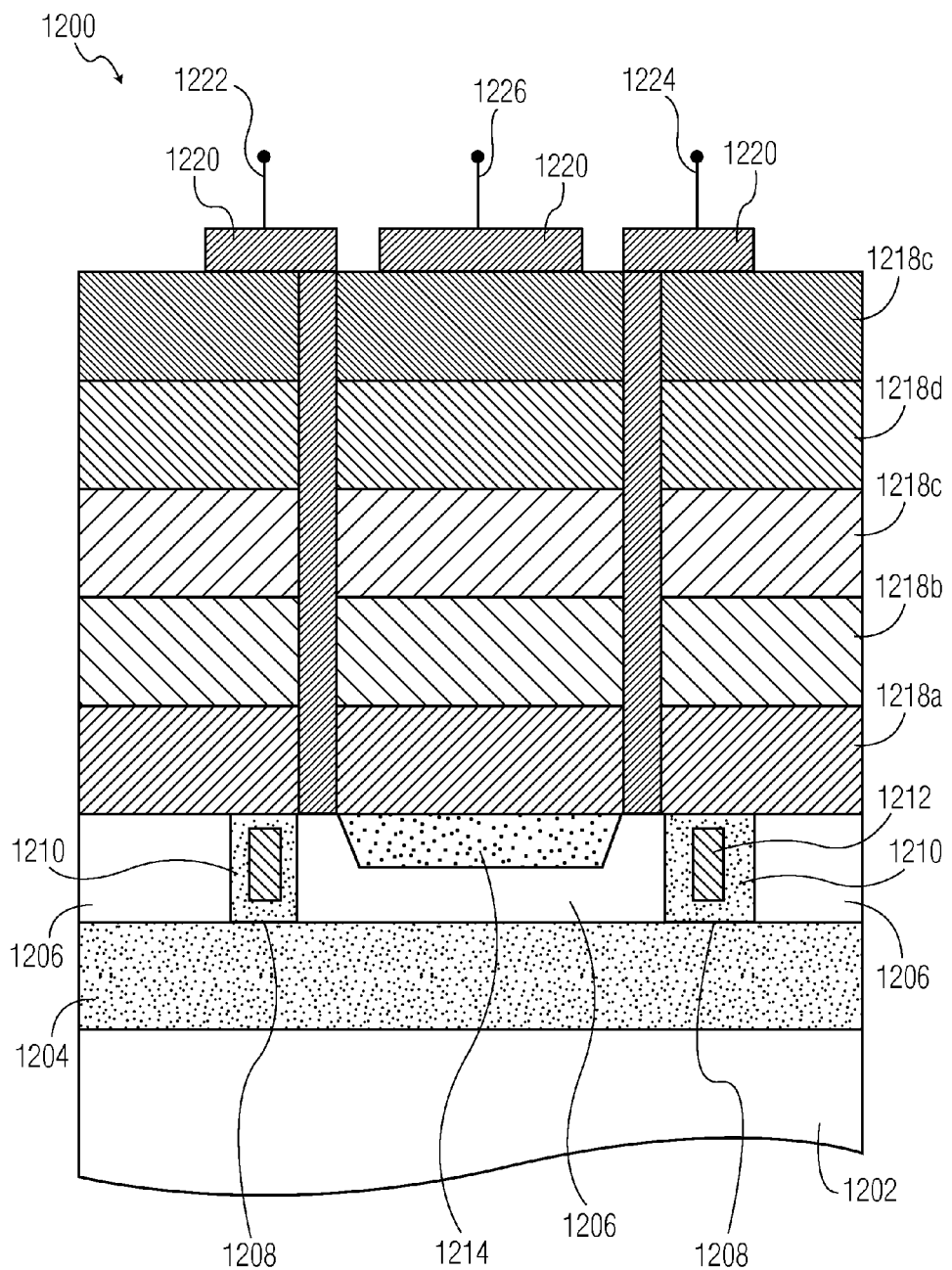
FIG. 12 illustrates an alternative embodiment of an isolation device.

FIG. 12 illustrates an alternative embodiment of an isolation device 1200 that may utilize a manufacturing method similar to what is shown and described in FIGS. 11a-11c. The isolation device 1200 may include a Si substrate 1202, an insulator layer 1204, an active Si layer 1206, medium trench isolators 1208, a shallow trench isolator 1214, a poly-Si layer 1216, dielectric layers 1218a, 1218b, 1218c, 1218d, and 1218e, and a metallization layer 1220. The medium trench isolators 1208 may include a SiO$_2$ portion 1210 and a poly-Si portion 1212. The metallization layer 1220 may form a first low voltage terminal 1222, a second low voltage terminal 1224, and a high voltage terminal 1226.

The Si substrate 1202 and the active Si layer 1206 may be implemented with other semiconductor materials, such as, for example, germanium. The insulator layer 1204, the medium trench isolators 1208, the shallow trench isolator 1214, and the dielectric layers 1218a, 1218b, 1218c, 1218d, and 1218d may be implemented with various other dielectric materials, such as, for example, silicon oxide, silicon nitride, and/or silicon oxide with some nitrogen content.

The dielectric layers 1218a, 1218b, 1218c, 1218d, and 1218e may allow the isolation device 1200 to be manufactured more efficiently with other semiconductor devices, and may improve the isolation of the active Si layer 1006. The thickness and material characteristics of the dielectric layers 1218a, 1218b, 1218c, 1218d, and 1218e, in addition to the thickness and material characteristics of the shallow trench isolator 1214, may affect the high voltage the isolation device 1200 may work with. Therefore, the isolation device 1200 may be designed to work with higher voltages than the isolation device 1100 shown in FIGS. 11a-11c. In some embodiments, the voltage applied to the high voltage terminal 1226 may exceed 1000 volts.

Alternatively, the embodiments shown and discussed in FIGS. 9-12 may incorporate a bulk silicon wafer rather than a SOI wafer. In the case of a bulk silicon wafer with n-type active silicon and p-type substrate (similar to FIG. 4), an additional contact to the p-type substrate may be included. The additional contact may be connected to ground or the lower of the two low voltage potentials to ensure the wafer is properly biased. In the case of a bulk silicon wafer with p-type active silicon, buried n-type well, and p-type substrate (similar to FIG. 5), additional contacts to the buried n-type well and the p-type substrate may be included. The buried n-type well may be connected to the higher of the two low voltage potentials, and the p-type substrate may be connected to ground or the lower of the two low voltage potentials to ensure the wafer is properly biased. The bulk silicon wafer, buried well, and active silicon may be implemented with other semiconductor materials, such as, for example, germanium.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. An isolation device comprising:
   a semiconductor layer;
   an insulation layer, wherein the insulation layer insulates a central portion of the semiconductor layer;
   a high voltage terminal interfacing with the insulation layer;
   a first low voltage terminal interfacing with a first non-insulated portion of the semiconductor layer; and
   a second low voltage terminal interfacing with a second non-insulated portion of the semiconductor layer, wherein the first and second low voltage terminals are electrically connected via the semiconductor layer, a voltage applied to the high voltage terminal influences conductance of the semiconductor layer, and all doped semiconductor layers have an identical doping polarity.

2. The isolation device of claim 1, wherein the high voltage terminal is galvanically isolated from the first and second low voltage terminals.

3. The isolation device of claim 1, wherein the semiconductor layer is a n-type semiconductor.

4. The isolation device of claim 1, wherein the semiconductor layer is a p-type semiconductor.

5. The isolation device of claim 1, wherein the non-insulated portions of the semiconductor layer are doped with more dopant than the central portion of the semiconductor layer.

6. The isolation device of claim 3, wherein the voltage applied to the high voltage terminal and the conductance of the semiconductor layer have a substantially linear relationship.

7. The isolation device of claim 1, wherein the voltage applied to the high voltage terminal is greater than 100 volts.

8. A method for isolating electrical systems, comprising:
   applying a first voltage to a high voltage terminal of an isolation device, wherein the first voltage includes an information signal;
   connecting a first low voltage terminal of the isolation device to a second voltage potential;
   connecting a second low voltage terminal of the isolation device to a third voltage potential; and
   obtaining information from the information signal by measuring at least one of a voltage, a current, a resistance, and a conductance at the first and second low voltage terminals, wherein the first voltage influences the conductance of a semiconductor layer of the isolation device and all doped semiconductor layers have an identical doping polarity.

9. The method of claim 8, wherein the high voltage terminal is galvanically isolated from the first and second low voltage terminals.

10. The method of claim 8, wherein the semiconductor layer is a n-type semiconductor.

11. The method of claim 8, wherein the semiconductor layer is a p-type semiconductor.

12. The method of claim 8, wherein the first voltage and the conductance of the semiconductor layer have a substantially linear relationship.

13. The method of claim 8, wherein the first voltage is greater than 100 volts.

14. A method for manufacturing an isolation device, comprising:
   insulating a central portion of a semiconductor layer with an insulation layer;
   connecting a high voltage terminal to the insulation layer;
   connecting a first low voltage terminal to a first non-insulated portion of the semiconductor layer; and
   connecting a second low voltage terminal to a second non-insulated portion of the semiconductor layer, wherein the first and second low voltage terminals are electrically connected via the semiconductor layer, a voltage applied to the high voltage terminal influences conductance of the semiconductor layer, and all doped semiconductor layers have an identical doping polarity.

15. The method of claim 14, wherein the high voltage terminal is galvanically isolated from the first and second low voltage terminals.

16. The method of claim 14, wherein the semiconductor layer is a n-type semiconductor.

17. The method of claim 14, wherein the semiconductor layer is a p⁻ type semiconductor.

18. The method of claim 14, further comprising:
   doping the non-insulated portions of the semiconductor layer with more dopant than the central portion of the semiconductor layer.

19. The method of claim 18, wherein the voltage applied to the high voltage terminal and the conductance of the semiconductor layer have a substantially linear relationship.

20. The method of claim 14, wherein the voltage applied to the high voltage terminal is greater than 100 volts.

* * * * *